United States Patent [19]

Yabe et al.

[11] 3,710,208

[45] Jan. 9, 1973

[54] SEMICONDUCTOR OSCILLATING ELEMENT AND CONTROL CIRCUIT THEREFOR

[75] Inventors: Masaya Yabe; Teizo Takahama; Masaru Kono; Katsumi Hirono, all of Kawasaki, Japan

[73] Assignee: Fuji Denki Seizo Kabushiki Kaisha, Kanagawa-ken, Japan

[22] Filed: April 6, 1971

[21] Appl. No.: 131,694

[30] Foreign Application Priority Data

April 7, 1970 Japan ....................45/29518
April 7, 1970 Japan ....................45/29519
April 7, 1970 Japan ....................45/29520
April 7, 1970 Japan ....................45/29521

[52] U.S. Cl. ..................317/235, 331/107, 307/278, 307/308

[51] Int. Cl. ....................H01l 5/00, H01l 11/10

[58] Field of Search....................317/234, 235

[56] References Cited

UNITED STATES PATENTS 3,284,723 11/1966 Henkels....................331/107
3,428,874 2/1969 Gerlach....................317/235
3,544,914 12/1970 Suga....................330/5

*Primary Examiner*—James D. Kallam
*Attorney*—Holman & Stern

[57] ABSTRACT

A novel semiconductor oscillating element comprising: a semiconductor wafer provided with a region of a first conductivity type, a region of a second conductivity type opposite to said first conductivity type, and a pn junction formed between said two regions; a minority carrier injection means provided on the region of said first conductivity type at a specific distance from the region of said second conductivity type; and electrodes provided on the region of said first conductivity type at specific distances respectively from said carrier injection means and from said region of said second conductivity type; said element being adapted for a device generating an oscillating voltage on an oscillating current, or a device converting a physical quantity into oscillating frequency.

Various modifications of the semiconductor oscillating element mentioned above are disclosed also.

12 Claims, 19 Drawing Figures

SEMICONDUCTOR OSCILLATING ELEMENT AND CONTROL CIRCUIT THEREFOR

BACKGROUND OF THE INVENTION

The present invention relates to a novel semiconductor oscillating element for generating an oscillating voltage or an oscillating current, and more particularly to a new semiconductor oscillating element having a simple construction in which, when a voltage higher than a critical value is applied thereto, a current flowing therethrough oscillates or an oscillating voltage is generated across electrodes provided thereon. The frequency of this oscillation can be varied by various methods. Therefore, it can be said that the application range of the element according to the present invention is very wide.

SUMMARY OF THE INVENTION

It is accordingly a primary object of the present invention to provide a semiconductor oscillating element having a simple construction and capable of attaining an oscillating function.

Another object of the present invention is to provide various developed embodiments of a semiconductor oscillating element in order to improve the characteristics thereof.

A further object of the present invention is to provide various means adapted to vary the oscillating frequency of the semiconductor oscillating element according to the invention.

A still further object of the present invention is to provide various application examples of the semiconductor oscillating element according to the invention.

The above and other objects of the invention have been effectively attained by a semiconductor oscillating element comprising: a semiconductor wafer which comprises a region having a first conductivity type, a region having a second conductivity type opposite to said first conductivity type and a pn junction formed between said two regions; a minority carrier injection means provided on the region having said first conductivity type at a distance from the region having said second conductivity type, said distance being substantially equal to the diffusion length of minority carriers in the region having said first conductivity type; and electrodes provided on the region having said first conductivity type at a first distance from the region having said second conductivity type and also at a second distance from said minority carrier injection means, said first distance being substantially equal to the diffusion length of said minority carriers and said second distance being sufficiently greater than the diffusion length of said monority carriers.

The nature, utility, principle and application of the present invention will be more clearly understood from the following detailed description with reference to the accompanying drawings, in which like parts are designated by like reference numbers.

DETAILED DESCRIPTION OF THE INVENTION

Figure 1:
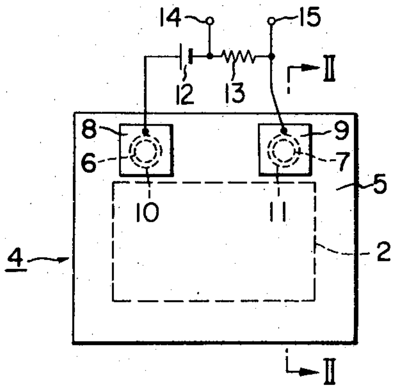
FIGS. 1, 3, 5, 7 and 10 are, respectively, plane views illustrating the various shapes and operation circuit of different embodiments of the semiconductor oscillating element according to the present invention.
Figure 2:
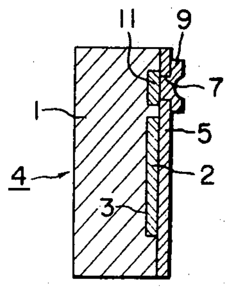
FIGS. 2, 4, 6, 8 and 11 are sectional views along line II—II in FIG. 1, line IV—IV in FIG. 3, line VI—VI in FIG. 5, line VIII—VIII in FIG. 7 and line XI—XI in FIG. 10, respectively.

With reference now to FIGS. 1 and 2, there is shown a semiconductor element comprising a semiconductor wafer 4 provided with an n type conductive region 1, a p type conductive region 2, and a pn junction 3 provided between said regions 1 and 2. The semiconductor wafer 4 is made of n-type monocrystal silicon having a specific resistance of 30 Ω-cm and has approximately surface dimension of 2 mm × 1.6 mm and thickness of 200 $\mu$, for instance. The region 2 is formed by selectively diffusing an element, for instance, boron, of the third group of the periodic table through a window opened through a film 5 of $SiO_2$ into the semiconductor wafer 4, and the thus formed region 2 has surface area, 1 $mm^2$, and thickness, 3 $\mu$. The region 2 has a specific resistance of 0.01 Ω-cm which is extremely lower than that of the region 1 having the original n-type of the semiconductor wafer 4.

Two holes 6 and 7 are provided in the oxide film 5 on the semiconductor wafer 4, and electrodes 8 and 9 are also provided by vacuum evaporation of, for instance, aluminum in such a way that said electrodes cover the holes 6 and 7, said electrodes 8 and 9 being ohmic contact with regions 10 and 11 provided beneath the holes 6 and 7, respectively. The region 10 has a $P^+$ conductivity type and is formed at the time when the region 2 is formed. Distance between the region 10 and the region 2 is selected to be substantially the same as the diffusion length of minority carriers, namely, holes in the region 1. More specifically, if the diffusion length of the holes is of the order of 80 to 140 $\mu$, the distance mentioned above will be about 100 $\mu$. On the other hand, the region 11 has an $n^+$ conductivity type and is approximately 1.5 $\mu$ in thickness. The region 11 is formed so that it is sufficiently spaced (for instance 850 $\mu$) from the region 10 and has a distance (100 to 200 $\mu$ in the above-mentioned example) substantially equal to the diffusion length of minority carriers from the region 2. Furthermore, the region 11 is formed so as to be small,for instance, approximately 50 $\mu$ in its diameter so that an electric field caused by an external electrical source may be concentrated in the vicinity of the region 11.

When a bias voltage which is forward with respect to the pn junction between the regions 10 and 1 is applied, the region 10 and the electrode 8 serve to inject minority carriers into the region 1.

An oscillating circuit utilizing the semiconductor oscillating element as mentioned above is illustrated in FIG. 1, in which a voltage is applied to said oscillating element through a series-connected resistor 13 from a d.c. source 12 so that the polarity of said voltage is of forward bias with respect to the pn junction between the regions 1 and 10. A current flowing through the electrodes 8 and 9 is converted into a voltage in the resistor 13, and the thus converted voltage is led out through terminals 14 and 15.

For the purpose of generating an oscillating voltage between the terminals 14 and 15, it is only required to apply a voltage within a limited range across the electrodes 8 and 9.

When the voltage is below a lower limit value, a small d.c. current flows, but upon exceeding of the voltage over the lower limit value, an oscillating current is superimposed on said small d.c. current. The frequency of the oscillating current varies continuously with variation of the applied voltage, but when the applied voltage reaches a certain upper limit value, the oscillation ceases and only a great d.c. current only flows.

Figure 12:
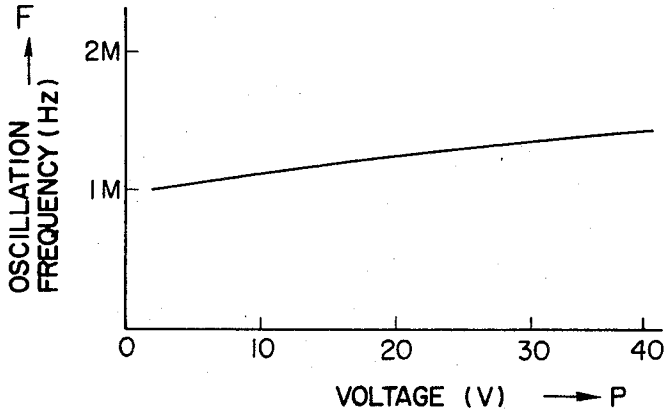
FIG. 12 is a graphic diagram illustrating relationships between applied voltage and oscillating frequency of the semiconductor oscillating element shown in FIG. 1.

FIG. 12 shows a graphic diagram illustrating the variation of oscillating frequency due to the variation of applied voltage in a sample. In FIG. 12, the abscissa represents the applied voltage P(V) and the ordinate the oscillating frequency F(Hz). In this sample, oscillation had started at an applied voltage 2.2 V and stopped at 80 V. In addition, from the oscillation start to the oscillation stop, the oscillating frequency was changed continuously from 1 MHz to 1.5 MHz.

Figure 13:
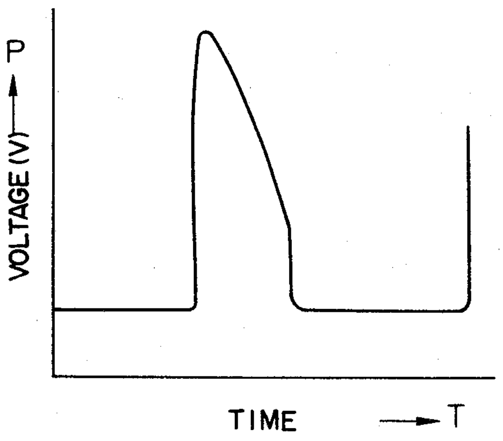
FIG. 13 is also a graphic diagram showing the waveform of an oscillating current of the oscillating element shown in FIG. 1.

FIG. 13 illustrates a waveform of the oscillating current, namely, a waveform of an voltage produced across the terminals 14 and 15 of the device illustrated in FIG. 1. In FIG. 13, the abscissa represents time T and the ordinate represents voltage P.

It is considered that the occurance of the above-mentioned oscillating phenomenon in the semiconductor element illustrated in FIGS. 1 and 2 is based on the following reasons:

At a moment when a voltage is applied across the electrodes 8 and 9 of the semiconductor oscillating element, a rush current flows from the region 10 through the region 1 to a capacitor which employs the pn junction between the region 1 and 2 as its insulating layer, and further from the side edge portion of the region 2, confronting to the region 11, through the region 1 again to the region 11. When the voltage of the electric source 12 is sufficiently high, the conductivity modulation is caused by positive holes injected toward the region 1 from the side edge portion of the region 2, confronting to the region 11, upon flowing of the rush current, whereby potential of the region 2 is rapidly drop, thus causing quick charging of the capacitor. With elapse of time, charging of the capacitor advances, and according to the advancement of the capacitor charge the charge current becomes smaller. When this current becomes lower than a certain value, the conductivity modulation ceases and the current rapidly decreases into a small residual current. On the other hand, some of the positive holes injected into the region 1 from the region 10 diffuses into the region 2. As the distance between the regions 10 and 2 is large enough to be substantially equal to the diffusion length of minority carriers, the quantity of the positive holes flowing into the region 2 is relatively small, as a result of which the action of said holes is not significant in the rush current flowing process. However, the potential of the region 2 is negative with respect to the region 1 even after disappearing of the rush current; therefore transferring of the holes to the region 2 is continued, so that the potential of the region 2 increases gradually. When this potential reaches a certain upper limit value, the holes are again injected toward the region 1 from the region 2 in the vicinity of the side edge portion adjacent to the region 11, whereby the conductivity modulation is induced and a current flowing through the region 1 toward the region 11 from the region 10 increases rapidly. Hereafter, the operation of the semiconductor oscillating element is cyclically conducted in accordance with the above-mentioned process.

Figure 3:
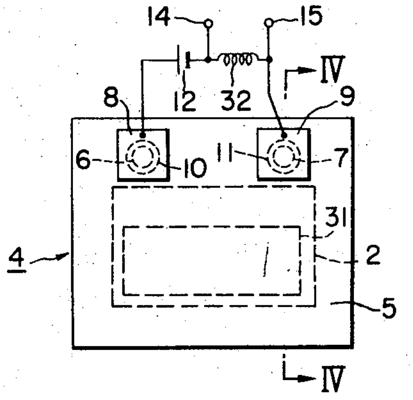
Figure 4:
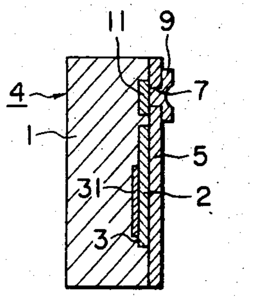

A semiconductor oscillating element illustrated in FIG. 3 and 4 is fundamentally identical to that in FIGS. 1 and 2. The specific feature of this element resides in that it has a region 31 between the region 1 and the region 2, said region 31 having the same conductivity type as that of the region 1 and a lower specific resistance. The region 3 is formed by selectively and deeply diffusing an element, for instance phosphorus, of the fifth group of the periodic table, before formation of the region 2. The region 3 has a specific resistance of 0.1 Ω-cm, and a size of 3 $\mu$ in thickness and 0.5 $mm^2$ in area. This additional region 31 serves to prevent a depletion layer from largely spreading toward the region 1 having a high specific resistance, when a reverse bias voltage is applied across the regions 1 and 2. As a result, capacitance of the simulative capacitor formed between the regions 1 and 2 increases, and the oscillating frequency decreases if the element is the same in dimension. Therefore, the additional region 31 has an advantage such that the dimension of the element can be made smaller under the same oscillating frequency.

Furthermore, in the element shown in FIGS. 3 and 4 an inductance 32 is connected in series with the electric source 12, whereby waveform of an output voltage is made smooth and therefore similar to a sine-wave.

Figure 5:
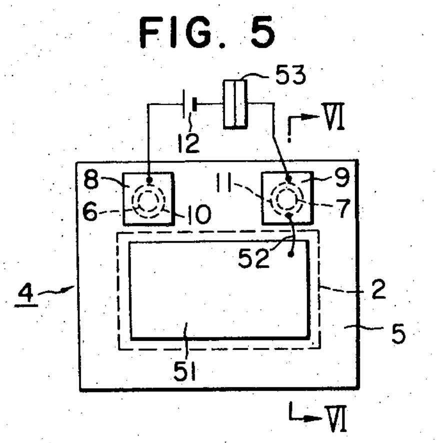
Figure 6:
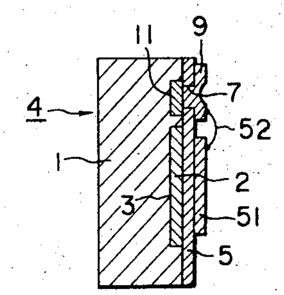

Now referring to FIGS. 5 and 6, a metal film 51 is formed on an oxide film 5 in such a manner that the metal film 51 covers the region 2, said metal film 51 being formed by vacuum evaporation of, for instance, aluminum, and being connected to the electrode 9 through a lead wire 52. If required, the electrode 9 and the film 51 may be simultaneously formed into one unit by vacuum evaporation of aluminum in order to eliminate the lead wire connecting work.

The film 51 and the region 2 form a kind of capacitor by employing the inserted oxide film 5 as its dielectric substance. Therefore, similarly to the effect of the foregoing examples, the oscillating frequency decreases if the element dimension is the same, and it is possible to make the element dimension smaller when the same oscillating frequency is to be obtained.

In addition, in this example an electroluminecent diode 53 is connected in series to the electric source 12. Therefore, a periodically blinking light can be obtained as an output of this device.

If an electromagnet is connected in place of the diode 53, a periodically increasing and decreasing magnetic flux can be obtained as its output.

Figure 7:
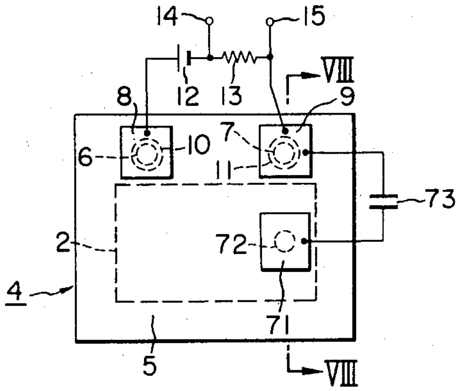
Figure 8:
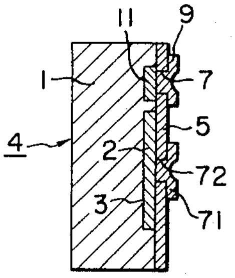

A semiconductor oscillating element illustrated in FIGS. 7 and 8 is greatly different from the examples shown above in that an electrode 71 is provided in ohmic contact with the region 2. More specifically, a hole 72 is provided in the oxide film 51 thereby to expose the surface of the region 2, and the electrode 71 formed by vacuum evaporation of, for instance, aluminum is in ohmic contact with the region 2.

In general, the electrode 71 is utilized for two purposes; one is for an oscillating frequency setting control and the other is for leading out of an output.

In the circuit shown in FIG. 7, the electrode 71 is used as the oscillating frequency setting control and a capacitor 73 in connected between the electrode 71 and the electrode 9.

The capacitor 73 forms an additional capacitance to the capacitance formed between the regions 1 and 2 thereby to decrease the oscillating frequency. When a capacitor having a large capacitance such as 1,000 $\mu$F is used as the capacitor 73, it is also possible to obtain an oscillating voltage having an extremely low frequency such as 0.01 Hz. Furthermore, since the frequency varies continuously and greatly with variation of the capacitance of the capacitor 73, if a capacitor capacitance of which can be varied with a rotary angle for instance is employed as the capacitor 73, it is possible to provide a detecting device for converting a rotary angle into a frequency.

Figure 14:
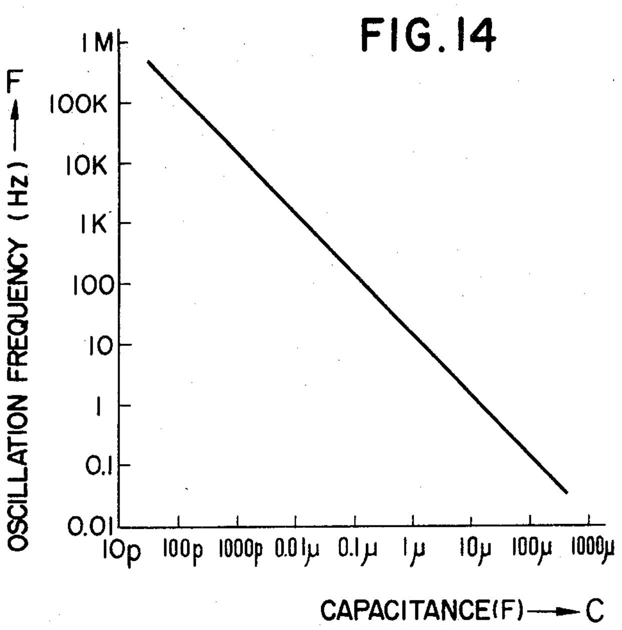
FIGS. 14 through 18 show performance characteristic curves used to explain the various control capabilities of the device shown in FIGS. 7 and 8.

In the graphic diagram FIG. 14 a relationship, of the oscillating frequency F(Hz) in ordinate versus the capacitance C(F) in abscissa, is illustrated in the case when a capacitor is connected to one sample and the capacitance of said capacitor is varied.

In addition, the semiconductor oscillating element illustrated in FIGS. 7 and 8 has a nature such that a delay time from application of the electric source till generation of an initial oscillating current varies according to variation of the capacitance of the capacitor 73.

Figure 15:
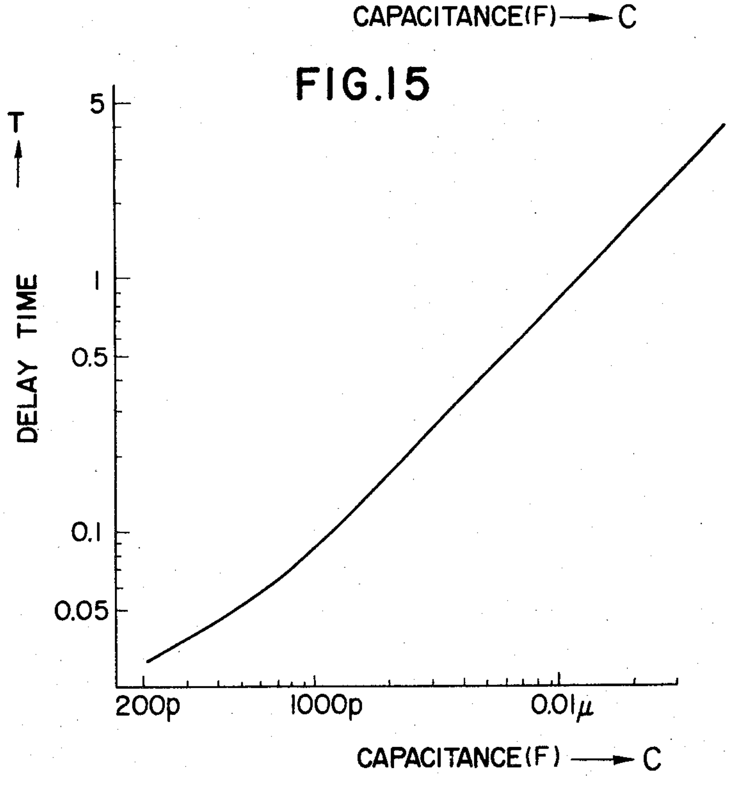

FIG. 15 shows a state in which a delay time from application of a voltage across the electrodes 8 and 9 till flowing of an initial oscillating current varies, with variation of the capacitance of the capacitor 73. The capacitance C(F) is shown on the abscissa, and the delay time T($\mu$ sec) on the ordinate.

By utilizing a nature that an oscillation starting delay time can be controlled according to the capacitance, for instance a control circuit of a thyrister firing phase can be formed.

In the semiconductor oscillating element illustrated in FIGS. 7 and 8, a capacitor can be connected between the electrodes 8 and 71. In this case, the oscillating frequency greatly decreases with increment of the capacitance, but delay of the oscillation start is not observed. The amplitude of an oscillating current is considerably larger than that in the case where the capacitor is connected between the electrodes 8 and 71. A resistor can be connected in place of the abovementioned capacitor 73 in the circuit. In this case, the resistor is connected at its one end to the electrode 71 and at its other end to any one of the electrodes 8 and 9, but completely different results are obtained by whether said other end of the resistor is connected to the electrode 8 or the electrode 9.

Figure 16:
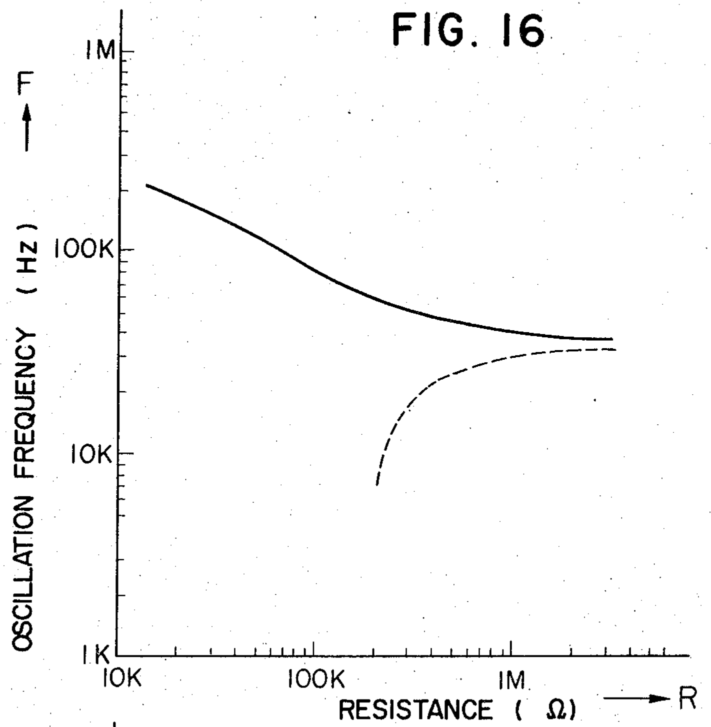

FIG. 16 illustrates variation of the oscillating frequency due to variation of the resistance of the resistor in one sample, in which the abscissa represents the resistance R (K$\Omega$) of the resistor while the ordinate represents the oscillating frequency F(Hz). In FIG. 16, a solid line is for the case where the resistor is connected between the electrodes 8 and 71, and a dotted line is for the case where the resistor is connected between the electrodes 9 and 71.

The resistor can be used in order to set the oscillating frequency at a desired value. However, if a thermistor, a photoconductive substance or the like is employed as the resistor, the circuit can be utilized as a device which converts a physical quantity of temperature, intensity of illumination, or the like into an oscillating frequency.

In addition, in the case when the resistor is connected between the electrodes 71 and 9, an oscillation starting voltage increases with decrement of the resistance value.

Figure 17:
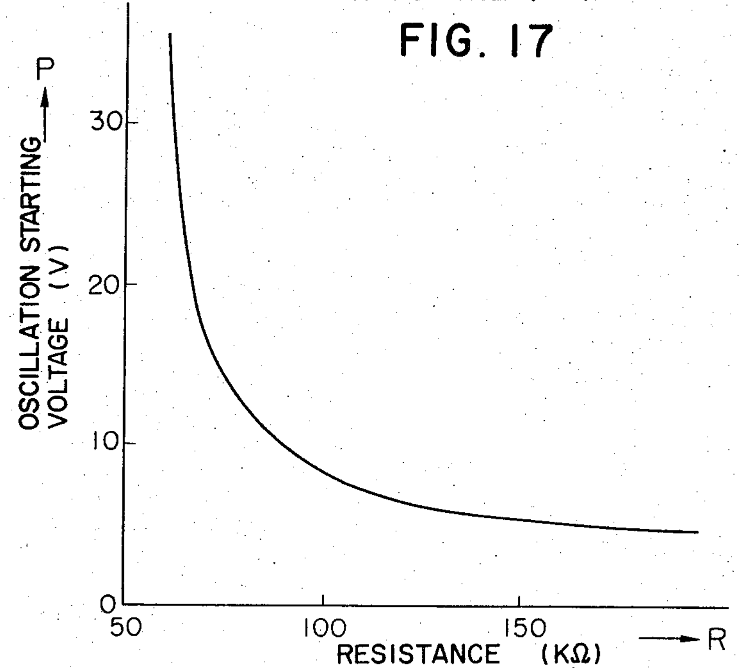

FIG. 17 shows a characteristic curve plotting variation of the oscillation starting voltage obtained when the resistance value of the resistor connected between the electrodes 9 and 71 is varied. The abscissa represents the resistance value R (K$\Omega$) of the resistor while the ordinate represents the oscillation starting voltage P(V).

If a component whose resistance value varies according to the above-mentioned physical quantity is employed as the resistor and if a voltage slightly higher or lower than the oscillation starting voltage is applied across the electrodes 8 and 9, it is possible to cause the fact that an oscillating state is changed to an oscillation stop state or vice versa according to variation of the physical quantity. For instance, the circuit thus formed can be effectively utilized as an over-heat detecting device or a flame detecting device.

Moreover, in the case when the resistor is connected between the electrodes 8 and 71, the oscillation starting voltage varies somewhat, though the variation is not so great as found in the case when the resistor is connected between the electrodes 9 and 71.

Furthermore, an electric source may be connected in place of the above-mentioned resistor or the capacitor. In this case, the oscillating frequency of the element is affected by both its polarity and voltage value. When one end of the electric source is connected to either of the electrodes 8 and 9 while the other end being connected to the electrode 71, if the electric source voltage is of a reverse bias with respect to the pn junction formed between the regions 1 and 2, the oscillating frequency enhanses with increase of the voltage value, and if the source is of a forward bias, the oscillation frequency decreases with increase of the voltage value.

Figure 18:
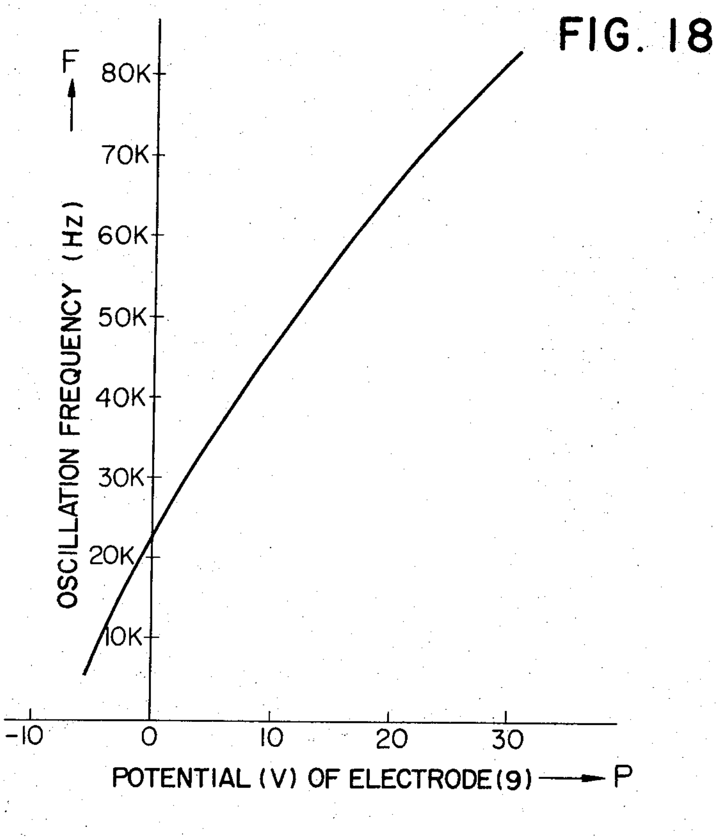

With reference to FIG. 18, the abscissa shows the potential P(V) of the electrode 9 with respect to the electrode 71 and the ordinate shows the oscillating frequency F(Hz), in case the electric source is connected between the electrodes 8 and 71. FIG. 18 illustrates dependance of control voltage vs. oscillating frequency of a sample.

This electric source can be utilized to set the oscillating frequency at a predetermined value or to convert a physical quantity into a frequency.

Figure 9:
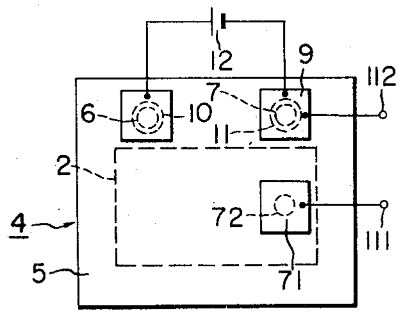
FIG. 9 is a wiring diagram illustrating another operation circuit of the semiconductor oscillating element shown in FIGS. 7 and 8.

Another embodiment of the semiconductor oscillating element shown in FIGS. 7 and 8 is illustrated in FIG. 9, in which the electrode 71 is used as an output electrode and terminals 111 and 112 are provided for the output electrode and the electrode 9, respectively.

Figure 19:
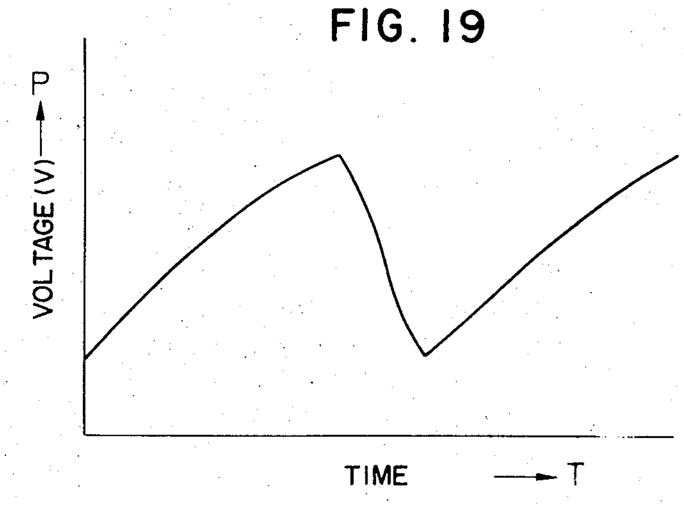
FIG. 19 is a graphic diagram showing the waveform of an output voltage obtained by a device shown in FIG. 9.

An example of the waveform of output voltage produced between the terminals 111 and 112 is shown in FIG. 19, in which time T is plotted on the abscissa while voltage P is plotted on the ordinate. The output terminal 112 may be connected to the electrode 8 instead of the electrode 9. In this case, the polarity is reversed, but a similar waveform can be obtained.

Figure 10:
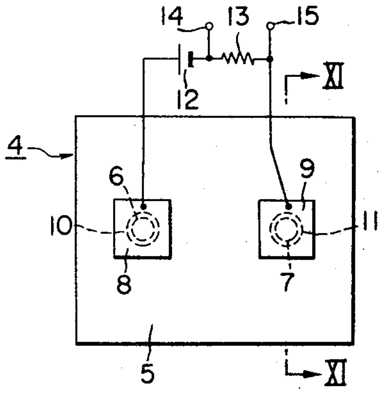
Figure 11:
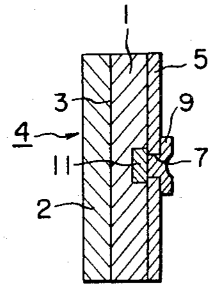

Shown in FIGS. 10 and 11 is a further embodiment of the semiconductor oscillating element. This element is different from the previously described ones in that the region 2 having a reverse conductivity type is provided on one side of the element, the side being opposite to a side where electrodes 8 and 9 are provided, and in that the region 2 is provided in such a manner that it fully covers the former side of the element. In this construction also, a distance between the region 2 and the regions 10 and 11 is substantially the same as the diffusion length of minority carriers in the region 1. If the distance between the electrodes 10 and 11 is sufficiently greater than the diffusion length, an oscillating action can be taken place in the same way.

An operating circuit of the element in this embodiment is the same as that of FIG. 1.

We claim:

1. A semiconductor oscillating circuit comprising, in combination: a semiconductor element which comprises a region having a first conductivity type, a region having a second conductivity type opposite to the first conductivity type, and a pn junction formed between said two regions, said region having the first conductivity type being provided with a minority carrier injection means provided at a distance from the region having the second conductivity type, said distance being substantially equal to the diffusion length of minority carriers in the region having the first conductivity, a first electrode provided on the minority carrier injection means, and a second electrode provided at a first distance from the region having the second conductivity type and at a second distance from the minority carrier injection means, said first distance being substantially equal to the diffusion length of minority carriers in the region having the first conductivity type, said second distance being greater than the first distance, said region having the second conductivity type being provided with a third electrode; and an electric source means for applying a voltage between the first electrode and the second electrode having a polarity such as to cause minority carriers to be injected from the minority carrier injection means into the region having the first conductivity type; an output developing element means connected in series circuit with the electric source means for developing an oscillating output; and a circuit element means connected between the third electrode and one of the first and second electrodes for effecting control of the frequency of the oscillating output.

2. A semiconductor oscillating circuit as claimed in claim 1 in which said output developing element means is an impedance element which develops an output voltage across terminals provided on the ends of said element, said output voltage corresponding to the oscillating current flowing through said element.

3. A semiconductor oscillating circuit as claimed in claim 1 in which said output developing element means is a conversion element which converts an electrical current into a predetermined physical quantity as an output.

4. A semiconductor oscillating circuit as claimed in claim 1, in which said circuit element means is a capacitor.

5. A semiconductor oscillating circuit as claimed in claim 4, in which said capacitor is a variable capacitor whereby the oscillating frequency of said oscillating circuit can be set at a desired value.

6. A semiconductor oscillating circuit as claimed in claim 4, in which the capacitance of said capacitor is varied according to the variation of a predetermined physical quantity whereby the output frequency of said oscillating circuit is varied according to the variation of the physical quantity.

7. A semiconductor oscillating circuit as claimed in claim 1, in which said circuit element means is a resistor.

8. A semiconductor oscillating circuit as claimed in claim 7, in which said resistor is a variable resistor whereby the oscillating frequency of said oscillating circuit can be set at a desired value.

9. A semiconductor oscillating circuit as claimed in claim 7, in which the resistance of said resistor is varied according to the variation of a predetermined physical quantity whereby the output frequency of said oscillating circuit is varied according to the variation of the physical quantity.

10. A semiconductor oscillating circuit as claimed in claim 1 in which said circuit element means is voltage source.

11. A semiconductor oscillating circuit as claimed in claim 10 in which at least one of the output voltage and polarity of said voltage source is variable whereby the output oscillating frequency of said oscillating circuit can be set at a desired value.

12. A semiconductor oscillating circuit as claimed in claim 10 in which at least one of the output voltage and polarity of said voltage source is varied according to the variation of a predetermined physical quantity whereby the output frequency of said oscillating circuit is varied according to the variation of the physical quantity.

* * * * *